United States Patent
Hosotani (10) Patent No.: US 9,520,544 B2
(45) Date of Patent: Dec. 13, 2016

(54) LIGHT SOURCE INCLUDING CERAMIC SUBSTRATE MOUNTED ON MOUNTING SUBSTRATE

(71) Applicant: Nichia Corporation, Anan-shi, Tokushima (JP)

(72) Inventor: Takuji Hosotani, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 14/869,499

(22) Filed: Sep. 29, 2015

(65) Prior Publication Data
US 2016/0093786 A1 Mar. 31, 2016

(30) Foreign Application Priority Data
Sep. 30, 2014 (JP) .................. 2014-199677

(51) Int. Cl.
- H01L 33/62 (2010.01)
- H01L 33/00 (2010.01)
- H01L 25/075 (2006.01)

(52) U.S. Cl.
CPC .......... *H01L 33/62* (2013.01); *H01L 25/0753* (2013.01); *H01L 2224/16225* (2013.01); *H01L 2933/0033* (2013.01); *H01L 2933/0066* (2013.01)

(58) Field of Classification Search
CPC ............. H01L 33/61; H01L 2933/0033; H01L 2933/0066
See application file for complete search history.

(56) References Cited

U.S. PATENT DOCUMENTS

| | | | | |
|---|---|---|---|---|
| 5,473,814 A | * | 12/1995 | White | H01L 21/563 257/E21.503 |
| 5,535,526 A | * | 7/1996 | White | H01L 21/563 228/180.22 |
| 6,133,626 A | * | 10/2000 | Hawke | H01L 25/0652 257/685 |
| 6,784,554 B2 | * | 8/2004 | Kajiwara | H01L 24/02 257/690 |
| 6,791,195 B2 | * | 9/2004 | Urushima | H01L 21/563 257/783 |
| 6,905,951 B2 | * | 6/2005 | Yoneda | H01L 21/4846 257/E21.503 |
| 7,582,973 B2 | * | 9/2009 | Hamaguchi | H01L 23/49827 257/700 |

(Continued)

FOREIGN PATENT DOCUMENTS

| JP | H06-318666 A | 11/1994 |
|---|---|---|
| JP | H09-017824 A | 1/1997 |

(Continued)

*Primary Examiner* — Ida M Soward
(74) *Attorney, Agent, or Firm* — Foley & Lardner LLP (57) ABSTRACT

A light source includes a light emitting element configured to emit a light; a mounting substrate; and a ceramic substrate having a light emitting element mounted thereon and being bonded to the mounting substrate via a plurality of metal bumps made of gold, copper, a gold alloy, or a copper alloy. A method of manufacturing a light source includes forming a plurality of metal bumps on a mounting substrate; providing a ceramic substrate having at least one light emitting element mounted thereon; and bonding the mounting substrate and a ceramic substrate to each other via the metal bumps.

4 Claims, 7 Drawing Sheets

(56) References Cited

U.S. PATENT DOCUMENTS

| | | | |
|---|---|---|---|
| 7,783,141 B2* | 8/2010 | Kodama | G02B 6/4204 |
| | | | 385/14 |
| 7,900,809 B2* | 3/2011 | Daves | B23K 3/0638 |
| | | | 228/178 |
| 9,064,858 B2* | 6/2015 | Pendse | H01L 21/563 |
| 2002/0027022 A1* | 3/2002 | Moriizumi | H01L 21/486 |
| | | | 174/267 |
| 2004/0177997 A1* | 9/2004 | Hata | H01L 21/4853 |
| | | | 174/257 |
| 2007/0246833 A1* | 10/2007 | Soga | H01L 23/24 |
| | | | 257/772 |
| 2010/0232744 A1* | 9/2010 | Asai | G02B 6/43 |
| | | | 385/14 |
| 2013/0285238 A1* | 10/2013 | Chen | H01L 23/49816 |
| | | | 257/738 |
| 2014/0210109 A1* | 7/2014 | Tanaka | H01L 23/3135 |
| | | | 257/778 |

FOREIGN PATENT DOCUMENTS

| | | |
|---|---|---|
| JP | 2001-210746 A | 8/2001 |
| JP | 2004-259798 A | 9/2004 |
| JP | 2006-005208 A | 1/2006 |
| JP | 2006-049695 A | 2/2006 |
| JP | 2008-021867 A | 1/2008 |
| JP | 2009-212492 A | 10/2008 |

\* cited by examiner

LIGHT SOURCE INCLUDING CERAMIC SUBSTRATE MOUNTED ON MOUNTING SUBSTRATE

CROSS-REFERENCE TO RELATED APPLICATION

This application claims priority to Japanese Patent Application No. 2014-199677, filed on Sep. 30, 2014, the contents of which are hereby incorporated by reference in their entirety.

BACKGROUND

Technical Field

The present disclosure relates to a light source, a method of manufacturing the light source, and a method of mounting the light source.

Description of Related Art

There are known semiconductor devices in which a supporting substrate is disposed on a mounting substrate (for example, see JP 2001-210746 A and JP 2004-259798 A).

JP 2001-210746 A discloses a ceramics multilayer wiring substrate to which bump conductors are bonded. As the bump conductors, solder balls are used.

JP 2004-259798 A discloses that, a semiconductor chip, a first chip supporting substrate supporting the semiconductor chip, a second chip supporting substrate on which the first chip supporting substrate is formed are disposed on a mounting substrate. Bump electrodes are formed at the second chip supporting substrate. The second chip supporting substrate is connected to the mounting substrate via the bump electrode. As the bump electrodes, solder balls are used.

However, the bumps made of solder balls cannot provide sufficient bonding strength between the ceramics multilayer wiring substrate and the mounting substrate.

SUMMARY

Accordingly, an object of certain embodiments of the present invention is to provide a light source exhibiting high bonding strength between a ceramic substrate and a mounting substrate, and a method of manufacturing the same.

A light source according to certain embodiments includes a light emitting element adapted to emit a light, a mounting substrate and a ceramic substrate. The light emitting element is mounted on the ceramic substrate, and the ceramic substrate is bonded to the mounting substrate via a plurality of metal bumps made of gold, copper, a gold alloy, or a copper alloy.

A method of manufacturing a light source according to certain embodiments includes forming a plurality of metal bumps on the mounting substrate, bonding the mounting substrate and a ceramic substrate having a light emitting element mounted thereon and being placed on the mounting substrate, to each other via the metal bumps.

A method of mounting according to certain embodiments includes forming a plurality of metal bumps on a mounting substrate, and bonding the mounting substrate and a ceramic substrate placed on the mounting substrate, to each other via the metal bumps.

According to the arrangement described above, a light source having high bonding strength between a ceramic substrate and a mounting substrate, and a method of manufacturing the same can be provided.

DETAILED DESCRIPTION

In the following, a light source and a method of manufacturing the same, according to embodiments of the present invention will be described. Note that the present invention is not limited to the embodiments and examples.

For the sake of convenience, the side of a mounting substrate on which light-emitting elements are disposed is referred to as the upper surface side or the plan side.

First Representative Embodiment

Figure 1:
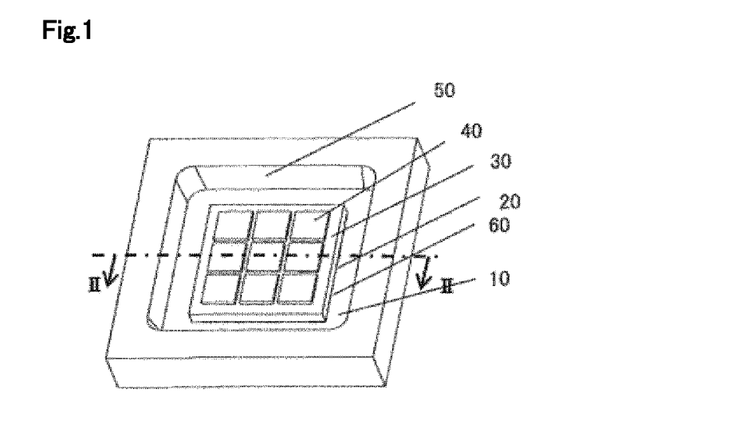
FIG. 1 is a schematic perspective view showing a light source according to a first embodiment.
Figure 2:
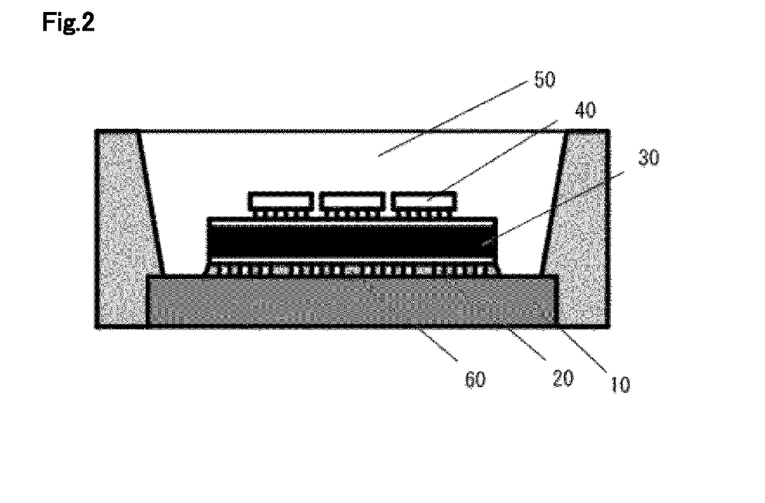
FIG. 2 is a schematic cross-sectional view, taken along line II-II in FIG. 1, showing the light source according to the first embodiment.

A light source according to a first embodiment will be described below with reference to the drawings. FIG. 1 is a schematic perspective view showing the light source according to the first embodiment. FIG. 2 is a schematic cross-sectional view, taken along line II-II in FIG. 1, showing the light source according to the first embodiment.

The light source includes a mounting substrate 10, metal bumps 20, a ceramic substrate 30, light-emitting elements 40, and a sealing member 50.

The mounting substrate 10 is an approximately rectangular parallelepiped member formed in a cup-shape having a bottom surface and side surfaces, and defining an opening. In a plan view, a periphery defining the opening of the cup-shaped portion has a quadrangular shape with rounded corners. The mounting substrate 10 can be formed with a copper material and a thermoplastic resin. For the thermoplastic resin, a polyphthalamide, a liquid crystal polymer, a polybutylene terephthalate (PBT), an unsaturated polyester or the like may be used. Alternatively, the mounting substrate 10 can be made of a copper material and ceramics. The mounting substrate 10 may have a planar shape. The mounting substrate 10 may be made solely of copper or a copper alloy. Also, a glass epoxy substrate, an epoxy substrate, or a metal substrate may be used as the mounting substrate 10. Electrical connection of the mounting substrate 10 with an external electrode can be established through a metal member disposed only on a predetermined portion while an insulating material is disposed on other portions.

On the ceramic substrate 30, the light-emitting elements 40 are mounted. The light-emitting elements 40 may be mounted either in a face up manner or in a face down manner. The light-emitting elements 40 are preferably nitride semiconductors, but other semiconductors can also be used.

The ceramic substrate 30 can be made of an electrically insulating material. Examples thereof include an alumina-based sintered body such as alumina ($Al_2O_3$), a mullite ($3Al_2O_3.2SiO_2$)-based sintered body, a silicon carbide (SiC)-based sintered body, a glass ceramics-based sintered body, an aluminum nitride (AlN). The ceramic substrate 30 is provided with a single-layer wiring or a multilayer wiring. The ceramic substrate 30 provided with the single-layer wiring or the multilayer wiring can be formed as follows. A metal paste is obtained by adding an appropriate organic resin binder, a plasticizer, and a solvent to powder of a high melting point metal such as tungsten, molybdenum, manganese or the like, and mixing them. The metal paste is applied on a ceramics green sheet in a predetermined pattern by using a print coating method. Then, the green sheet is calcined.

The ceramic substrate 30 on which the light-emitting elements 40 are mounted is bonded to the mounting substrate 10 using a plurality of metal bumps 20 made of gold, copper, a gold alloy or a copper alloy. Gold is preferable but a gold alloy whose main component is gold may also be used. In the case of using gold as the main component, 75% by weight or more of gold is contained, in which 80% by weight or more is preferable and 90% by weight or more is most preferable. From the viewpoint of reflectivity, ductility, and malleability, gold is preferable. However, copper or a copper alloy can also be used. A plurality of metal bumps 20 are used. The metal bumps 20 can be formed on the entire mounting surface of the ceramic substrate 30, but the metal bumps 20 can also be formed densely at a location where cracks are prone to occur. For example, the metal bumps 20 may be densely arranged in the vicinity of the center of the ceramic substrate 30, and may be sparsely arranged in the vicinity of outer periphery of the ceramic substrate 30. In the case where the ceramic substrate 30 has a shape long in one direction, cracks are prone to occur in the direction perpendicular to the length direction. Accordingly, a plurality of columns of metal bumps 20 may be formed in the length direction in the vicinity of the center of the length direction.

The light-emitting elements 40 and the ceramic substrate 30 are covered by the sealing member 50. For the sealing member 50, a thermosetting resin such as an epoxy resin, a silicone resin, or the like can be used, and other than those resins, glass may also be used.

In a plan view, a resin 60 is filled between a plurality of metal bumps 20, so as to improve the bonding strength between the ceramic substrate 30 and the mounting substrate 10. The resin 60 may contain particles having high thermal conductivity, such as silver, copper, aluminum and the like.

With the arrangement described above, heat accumulated in the ceramic substrate 30 can be efficiently transferred to the mounting substrate 10 side.

In the case of bonding the ceramic substrate 30 and the mounting substrate 10 made of a copper material, due to difference in the thermal hysteresis during solder mounting, arising from a large difference in coefficients of thermal expansion therebetween, a great thermal stress may be loaded on the ceramic substrate, resulting in occurrence of cracks. Solder mounting requires a reflow step, and it is considered that cracks attributed to the difference in coefficients of thermal expansion between the ceramic board 30 and the mounting substrate 10 occur in the reflow step. In order to prevent occurrence of cracks in the ceramic substrate 30, bonding with the use of an epoxy resin may be considered, with the aim of reducing the stress. However, as compared to bonding using solder, the bonding property and the heat releasing property are largely reduced. Hence, the use of an epoxy resin has been disadvantageous. Accordingly, as the light source according to the first embodiment, bonding the ceramic substrate 30 having the light emitting elements 40 mounted thereon and the mounting substrate 10 by using a plurality of metal bumps 20 made of gold, copper, a gold alloy, or a copper alloy allows for production of a light source in which the bonding strength between the ceramic substrate 30 and the mounting substrate 10 is enhanced and good heat releasing property can be obtained. Further, since the metal bumps 20 are used, gaps are created between the ceramic substrate 30 and the mounting substrate 10 in a cross-sectional view. Due to the gaps or the like, reduction in the thermal stress between the ceramic substrate 30 and the mounting substrate 10 and reduction in the occurrence of cracks in the ceramic substrate 30 can be achieved. By filling the gaps with the resin 60, the bonding strength can further be improved, and also the heat releasing effect can be improved.

A method of manufacturing the light source according to the first embodiment will be described with reference to the drawings. FIGS. 3 to 6 are schematic cross-sectional views illustrating the steps of manufacturing the light source according to the first embodiment.

Figure 3:
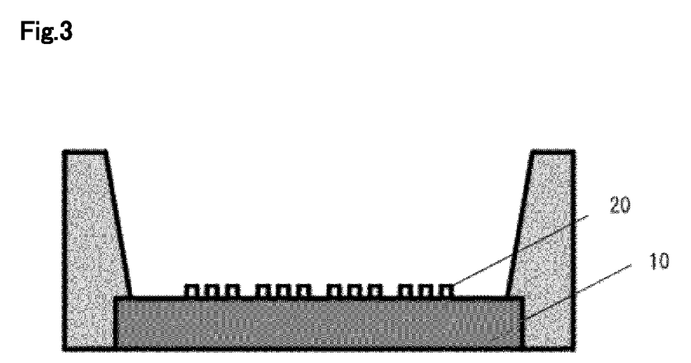
FIG. 3 is a schematic cross-sectional view showing a step of manufacturing the light source according to the first embodiment.

A plurality of metal bumps 20 are formed on the mounting substrate 10.

A plurality of metal bumps 20 are formed on a surface of the mounting substrate 10 that serves as an inner bottom surface of a cup-shaped portion. For example, the metal bumps 20 may each have a diameter of about 60 μm to about 120 μm, and a height of about 20 μm to about 50 μm. The metal bumps 20 are arranged in the longitudinal and lateral directions. Metal bumps 20 made of gold are typically used, but metal bumps made of copper, a gold alloy, or a copper alloy can also be used. A purity of gold of 95% or more is preferable, and 99% or more is more preferable.

Figure 4:
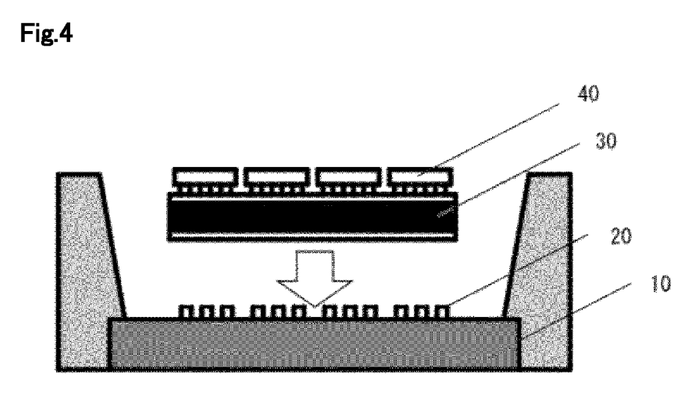
FIG. 4 is a schematic cross-sectional view showing a step of manufacturing the light source according to the first embodiment.

On the mounting substrate 10, the ceramic substrate 30 on which the light-emitting elements 40 are mounted is placed, and the mounting substrate 10 and the ceramic substrate 30 are bonded to each other via the metal bumps 20.

The ceramic substrate 30 has an approximately quadrangular shape in a plan view. On the ceramic substrate 30, the light-emitting elements 40 are arranged in a matrix of three rows and three columns. The number of the light-emitting elements 40 can be changed as appropriate. The light-emitting elements 40 are mounted in a face down manner on the ceramic substrate 30.

Bonding between the mounting substrate 10 and the ceramic substrate 30 can be performed at a temperature of 100° C. to 200° C., while applying a pressure of 1.0 kg/mm$^2$ to 5.0 kg/mm$^2$.

Figure 5:
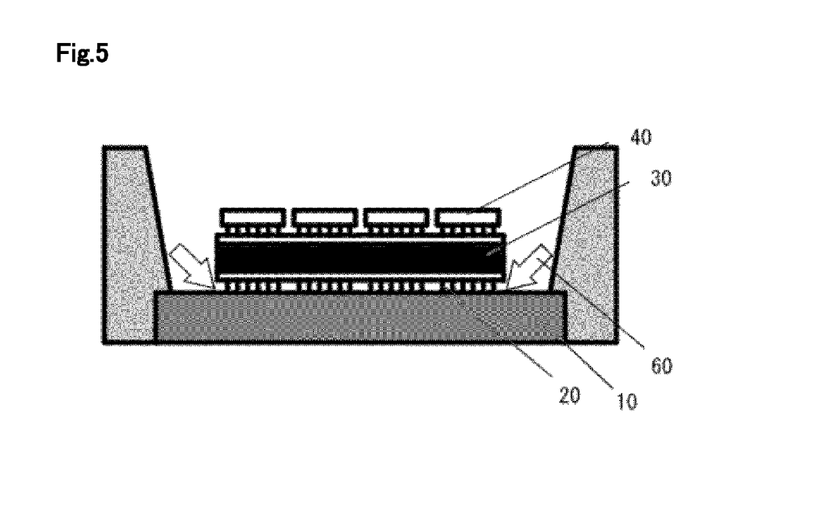
FIG. 5 is a schematic cross-sectional view showing a step of manufacturing the light source according to the first embodiment.

Next, the resin 60 is poured into the gap between the mounting substrate 10 and ceramic substrate 30. An epoxy resin is used as the resin 60, and a silver filler is contained in the epoxy resin.

The viscosity of the epoxy resin is adjusted as appropriate in view of wettability or the like of the mounting substrate 10 and the ceramic substrate 30. For example, the epoxy resin with a discharge pressure of 150 kPa to 400 kPa is preferably employed. A silver filler having a particle size of about 0.1 μm to about 10 μm can be used.

Figure 6:
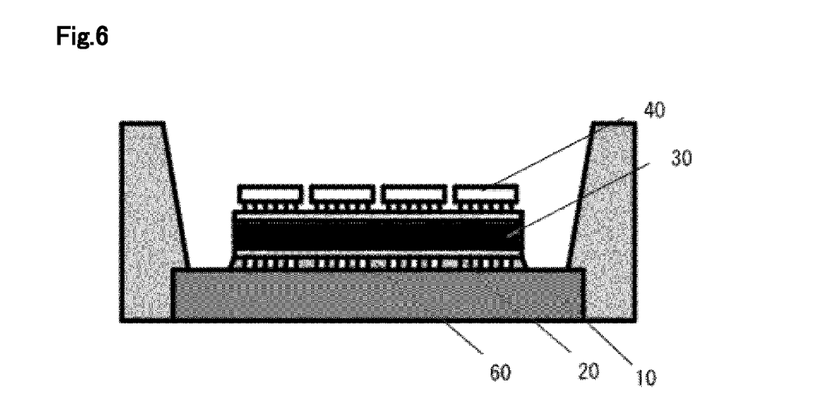
FIG. 6 is a schematic cross-sectional view showing a step of manufacturing the light source according to the first embodiment.

Next, using the sealing member 50, the light-emitting elements 40 on the ceramic substrate 30 are covered. The sealing member 50 is applied by potting. In place of potting, any appropriate application method such as spraying, compression molding, extrusion molding, injection molding, transfer molding or the like may be used. The sealing member 50 may be made of an epoxy resin, a silicone resin or the like. The sealing member 50 is cured.

Thus, the light source according to the first embodiment can be easily manufactured.

In the first embodiment, the resin 60 is used, but the light emitting elements 40 may be covered with the sealing member 50 after bonding the ceramic substrate 30, without the use of the resin 60.

Second Representative Embodiment

Figure 7:
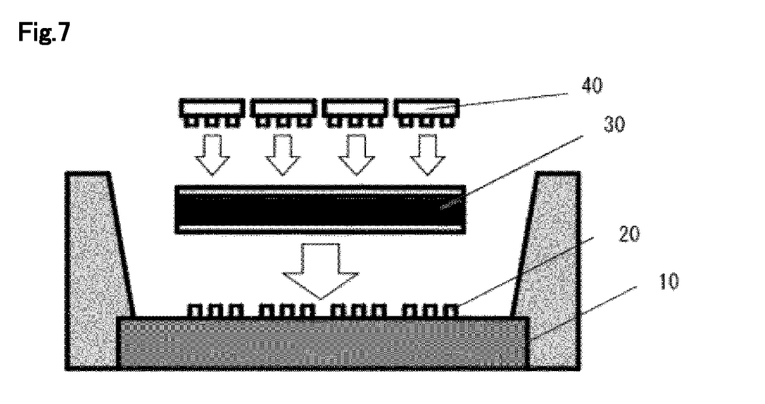
FIG. 7 is a schematic cross-sectional view showing a step of manufacturing a light source according to a second embodiment.

In place of the method of manufacturing a light source according to the first embodiment, the light source according to the first embodiment can be manufactured by a method of manufacturing a light source according to a second embodiment. FIG. 7 is a schematic cross-sectional view showing the process of manufacturing a light source according to the second embodiment.

First, a plurality of metal bumps 20 are formed on the mounting substrate 10.

Next, the ceramic substrate 30 is placed on the mounting substrate 10, and the mounting substrate 10 and the ceramic substrate 30 are bonded to each other via the metal bumps 20.

Next, the light-emitting elements 40 are mounted on the ceramic substrate 30.

Next, the resin 60 is poured into the gap between the mounting substrate 10 and the ceramic substrate 30.

Next, the light-emitting elements 40 on the ceramic substrate 30 are covered with the sealing member 50.

The light-emitting elements 40 are mounted on the ceramic substrate 30 after the mounting substrate 10 and the ceramic substrate 30 are bonded to each other, so that the heat at the time of bonding the mounting substrate 10 and the ceramic substrate 30 does not influence the light-emitting elements 40. Hence, thermal damage to the light-emitting elements 40 can be reduced.

Third Representative Embodiment

Figure 8:
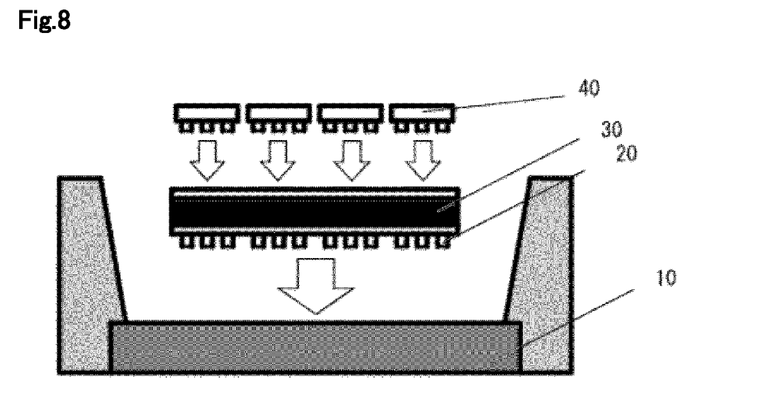
FIG. 8 is a schematic cross-sectional view showing a step of manufacturing a light source according to a third and a fourth embodiments.

In place of the method of manufacturing a light source according to the first embodiment, the light source according to the first embodiment can be manufactured by a method of manufacturing a light source according to a third embodiment. FIG. 8 is a schematic cross-sectional view showing the process of manufacturing a light source according to the third embodiment.

A plurality of metal bumps 20 made of gold, copper, a gold alloy or a copper alloy are formed on the ceramic substrate 30. The metal bumps 20 are formed on the back surface side of the ceramic substrate 30.

The ceramic substrate 30 is placed on the mounting substrate 10, and the mounting substrate 10 and the ceramic substrate 30 are bonded to each other via the metal bumps 20.

The light-emitting elements 40 are mounted on the ceramic substrate 30.

The metal bumps 20 are formed on the ceramic substrate 30 side, so that the alignment control between the ceramic substrate 30 and the mounting substrate 10 can be eliminated. In the case where the cup-like mounting substrate 10 is used, the metal bumps 20 may be difficult to be formed in the cup. In such a case, with the use of a planar ceramic substrate 30, the metal bumps 20 can be easily formed.

The light-emitting elements 40 are mounted on the ceramic substrate 30 after the mounting substrate 10 and the ceramic substrate 30 are bonded to each other, so that the heat at the time of bonding the mounting substrate 10 and the ceramic substrate 30 does not influence the light-emitting elements 40. Hence, thermal damage to the light-emitting elements 40 can be reduced.

Fourth Representative Embodiment

In place of the method of manufacturing a light source according to the first embodiment, the light source according to the first embodiment can be manufactured also by a method of manufacturing a light source according to a fourth embodiment. FIG. 8 is a schematic cross-sectional view showing the process of manufacturing a light source according to the fourth embodiment.

A plurality of metal bumps 20 made of gold, copper, a gold alloy or a copper alloy are formed on the ceramic substrate 30 on which the light-emitting elements 40 are mounted.

The ceramic substrate 30 is placed on the mounting substrate 10, and the mounting substrate 10 and the ceramic substrate 30 are bonded to each other via the metal bumps 20.

The metal bumps 20 are formed on the ceramic substrate 30 side, so that the alignment control between the ceramic substrate 30 and the mounting substrate 10 can be eliminated. Further, in the case where the cup-like mounting substrate 10 is used, the metal bumps 20 may be difficult to be formed in the cup. In such a case, with the use of a planar ceramic substrate 30, the metal bumps 20 can be easily formed.

Note that, in the methods of manufacturing a light source according to the second to fourth embodiments, in the step of bonding the mounting substrate 10 and the ceramic substrate 30 to each other, the gaps between the metal bumps 20 may be filled with the resin 60 after the bonding with the metal bumps 20.

Further, in the methods of manufacturing a light source according to the second to fourth embodiments, the light-emitting elements 40 on the ceramic substrate 30 is covered with the sealing member 50.

Method of Mounting

A method of mounting the mounting substrate 10 and the ceramic substrate 30 will be described below.

A plurality of metal bumps 20 are formed on the mounting substrate 10.

The ceramic substrate 30 is placed on the mounting substrate 10, and the mounting substrate 10 and the ceramic substrate 30 are bonded to each other via the metal bumps 20.

Further, as another embodiment, a plurality of metal bumps 20 made of gold or a gold alloy are formed on the ceramic substrate 30. On the mounting substrate 10, the ceramic substrate 30 is placed, and the mounting substrate 10 and the ceramic substrate 30 are bonded to each other via the metal bumps 20.

The thermal hysteresis during bonding of the mounting substrate 10 and the ceramic substrate 30 to each other can be reduced. Thus, occurrence of cracks in the ceramic substrate 30 can be prevented.

Other Constituent Elements

It is also possible to arrange a light-transmissive substrate on the light-emitting elements. The light-transmissive substrate may contain one or more of a phosphor, a reflective member, a light-diffusing member and the like. The light-emitting elements and the light-transmissive substrate may be bonded to each other using an adhesive agent. Further, it is also possible to dispose the light-emitting elements on the bottom surface in the cup of the cup-like mounting substrate, arrange a light-transmissive substrate on the light-emitting elements, and fix the outer circumference by resin. The resin may be filled in the cup. The resin may contain one or more of a light-reflective material, a diffusing agent, a heat conductive member, pigment, a light-absorbing agent and the like, the resin preferably contains a light-reflective material. This is because, the light from the light-emitting elements is irradiated on the resin that contains the light-reflective material, then is reflected and emitted to the outside. The resin is preferably a thermosetting resin such as an epoxy resin, a silicone resin, an urea resin or the like, but it is also possible to employ a thermoplastic resin such as a polyphthalamide, a liquid crystal polymer, a polybutylene terephthalate (PBT), an unsaturated polyester or the like.

The sealing member may contain one or more of a phosphor, a diffusing agent, a heat conductive member, a pigment, a light-absorbing agent and the like. A protective element may be disposed on the ceramic substrate. The light-emitting elements can be mounted on the ceramic substrate in a face down manner by using metal bumps, or may be mounted in a face up manner by using a resin.

Example 1

Figure 9:
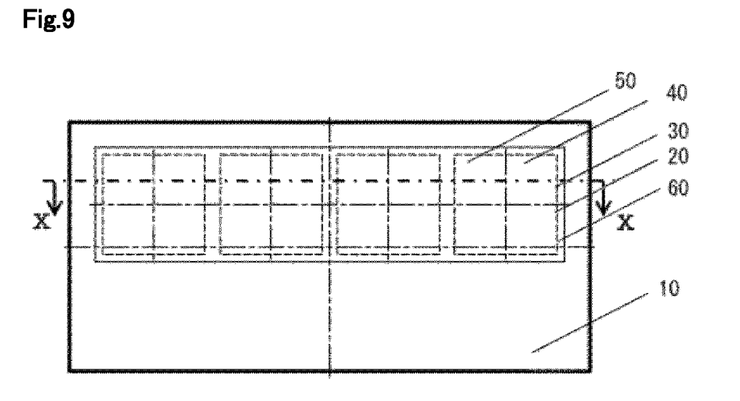
FIG. 9 is a schematic plan view showing a light source according to Example 1.
Figure 10:
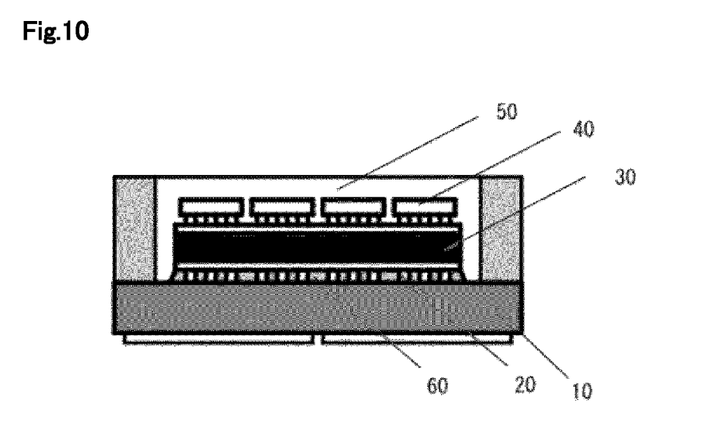
FIG. 10 is a schematic cross-sectional view, taken along line X-X in FIG. 9, showing the light source according to Example 1.
Figure 11:
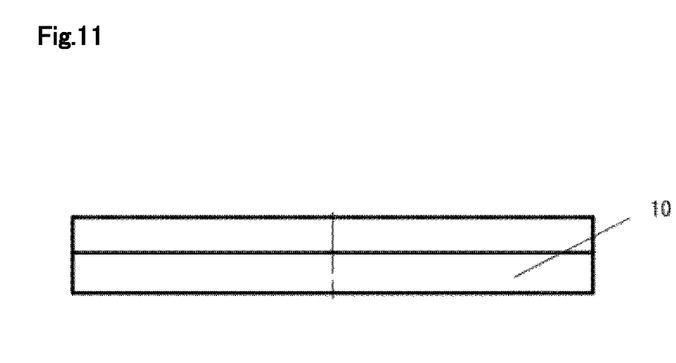
FIG. 11 is a schematic side view showing the light source according to Example 1.
Figure 12:
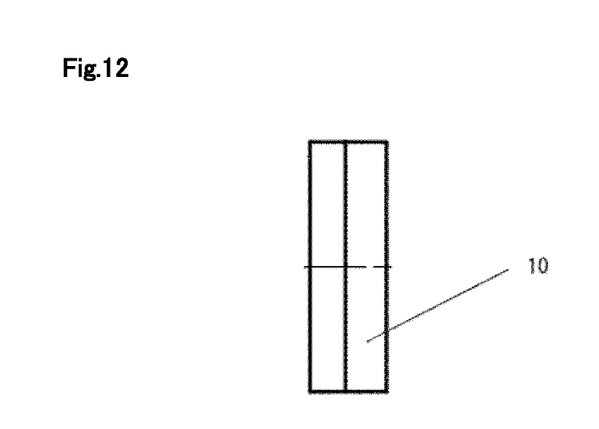
FIG. 12 is a schematic side view showing the light source according to Example 1.
Figure 13:
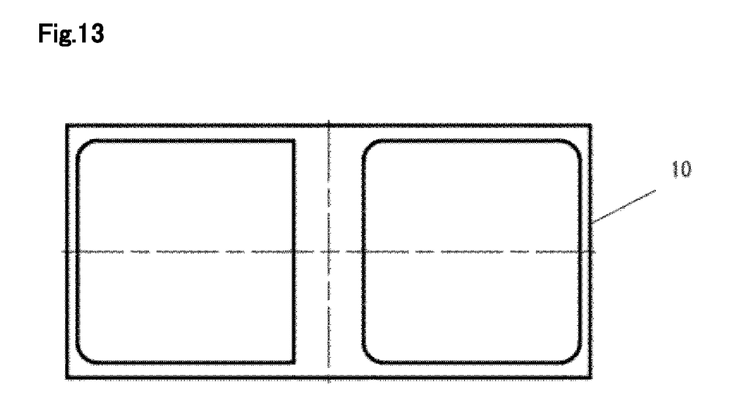
FIG. 13 is a schematic back view showing the light source according to Example 1.

A light source according to Example 1 will be described below with reference to drawings. FIG. 9 is a schematic plan view showing the light source according to Example 1. FIG. 10 is a schematic cross-sectional view, taken along line X-X in FIG. 9, showing the light source according to Example 1. FIG. 11 is a schematic side view showing the light source according to Example 1. FIG. 12 is a schematic side view showing the light source according to Example 1. FIG. 13 is a schematic back view showing the light source according to Example 1. The description of the structure substantially similar to that of the light source according to the first embodiment may be partially omitted.

The light source includes the mounting substrate 10, the metal bumps 20, the ceramic substrate 30, the light-emitting elements 40, the sealing member 50, and the resin 60.

The mounting substrate 10 is made of a planar copper material and a thermoplastic resin. For the thermoplastic resin, a polyphthalamide is used. The mounting substrate 10 has an approximately rectangular parallelepiped shape, with a longitudinal length of 2.5 mm, a lateral length of 5.1 mm, and a height of 0.75 mm. The mounting substrate 10 has an approximately rectangular cup-like shape in a plan view, with a longitudinal length of 1.2 mm, a lateral length of 4.6 mm, and a depth of about 0.35 mm. At the back surface of the mounting substrate 10, an anode electrode and a cathode electrode each having an approximately square shape with a side of about 2.1 mm are disposed respectively.

The ceramic substrate 30 has a plate-like and approximately rectangular parallelepiped shape, with a longitudinal length of 1.0 mm, a lateral length of about 4.4 mm, and a thickness of 0.2 mm. The main component of the ceramic substrate 30 is alumina, and the ceramic substrate 30 includes predetermined internal wiring and external wiring.

On the ceramic substrate 30, the light-emitting elements 40 are mounted. The light-emitting elements 40 each has a substantially square shape, with a side of about 800 μm. Four light-emitting elements 40 are mounted in the length direction of the ceramic substrate 30.

A plurality of metal bumps 20 are formed on the mounting substrate 10. The metal bumps 20 are made of gold. The metal bumps 20 each have a diameter of 60 μm to 120 μm and a height of about 40 μm. The purity of gold is 99.9%.

The ceramic substrate 30 on which the light-emitting elements 40 are mounted and the mounting substrate 10 are bonded to each other using the metal bumps 20.

At the gap between the mounting substrate 10 and the ceramic substrate 30, the resin 60 is arranged. For the resin 60, a phenyl silicone resin containing silver particles is used.

The sealing member 50 contains a phosphor. For the sealing member 50, a dimethyl silicone resin is used, and for the phosphor, a YAG phosphor is used.

Thus, the light source having high bonding strength between the mounting substrate 10 and the ceramic substrate 30 can be provided.

The light source according to Example 1 can be manufactured according to a method described below.

A plurality of metal bumps 20 are formed on the mounting substrate 10. The metal bumps 20 are made of gold, and arranged in a matrix of three columns and twelve rows.

Next, the ceramic substrate 30 on which the light-emitting elements 40 are mounted is placed on the mounting substrate 10, and the mounting substrate 10 and the ceramic substrate 30 are bonded to each other via the metal bumps 20. The mounting substrate 10 and the ceramic substrate 30 are bonded to each other via the metal bumps 20 under a temperature of 100° C. to 200° C. and a pressure of 2.2 kg/mm$^2$.

Next, the resin 60 is poured into the gap between the mounting substrate 10 and the ceramic substrate 30.

The resin 60 is poured at a discharge pressure of 160 kPa to 350 kPa so that the resin 60 enters the gap between the mounting substrate 10 and the ceramic substrate 30.

Next, the sealing member 50 is poured from above the light-emitting elements 40. The sealing member 50 is applied by potting from above the light-emitting elements 40.

Thus, the light source can be easily manufactured.

The light source according to the embodiments of the present invention can be used for light source for lighting applications, on-vehicle light source, light source for mobile phones and the like.

As shown in the above, a light source, a method of manufacturing the light source, and a method of mounting the light source are illustrated in accordance with the embodiments for carrying out the present invention, but the scope of the invention is not limited to the above description, and should be widely understood based on the scope of claim for patent. Further, based on the above description, it will be obvious that various changes and modifications can be made therein without departing from the scope of the invention.

What is claimed is:

1. A light source comprising:
   a light emitting element configured to emit a light;
   a mounting substrate; and
   a ceramic substrate having the light emitting element mounted thereon, the ceramic substrate being bonded to the mounting substrate via a plurality of metal bumps made of gold, copper, a gold alloy, or a copper alloy.

2. The light source according to claim 1, further comprising a resin disposed in gaps between the plurality of metal bumps.

3. The light source according to claim 1, wherein the mounting substrate comprises copper or a copper alloy.

4. The light source according to claim 2, wherein the mounting substrate comprises copper or a copper alloy.

* * * * *